United States Patent
Cherala

(10) Patent No.: US 12,269,282 B2
(45) Date of Patent: Apr. 8, 2025

(54) NANOIMPRINT LITHOGRAPHY TEMPLATE WITH PERIPHERAL POCKETS, SYSTEM OF USING THE TEMPLATE, AND METHOD OF USING THE TEMPLATE

(71) Applicant: CANON KABUSHIKI KAISHA, Tokyo (JP)

(72) Inventor: Anshuman Cherala, Austin, TX (US)

(73) Assignee: CANON KABUSHIKI KAISHA, Tokyo (JP)

(*) Notice: Subject to any disclaimer, the term of this patent is extended or adjusted under 35 U.S.C. 154(b) by 113 days.

(21) Appl. No.: 17/502,370

(22) Filed: Oct. 15, 2021

(65) Prior Publication Data

US 2023/0120053 A1 Apr. 20, 2023

(51) Int. Cl.
*B41N 1/14* (2006.01)
*G03F 7/00* (2006.01)

(52) U.S. Cl.
CPC .............. *B41N 1/14* (2013.01); *G03F 7/0002* (2013.01)

(58) Field of Classification Search
None
See application file for complete search history.

(56) References Cited

U.S. PATENT DOCUMENTS

| | | |
|---|---|---|
| 6,936,194 B2 | 8/2005 | Watts |
| 7,157,036 B2 | 1/2007 | Choi et al. |
| 7,768,624 B2 | 8/2010 | Cherala et al. |
| 8,066,930 B2 | 11/2011 | Sreenivasan et al. |
| 8,076,386 B2 | 12/2011 | Xu et al. |
| 8,349,241 B2 | 1/2013 | Sreenivasan et al. |
| RE47,483 E | 7/2019 | Resnick et al. |
| 10,895,806 B2 | 1/2021 | Patel et al. |
| 2005/0270516 A1 | 12/2005 | Cherala et al. |
| 2008/0160129 A1 | 7/2008 | Resnick et al. |
| 2010/0096764 A1 | 8/2010 | Lu |
| 2012/0061875 A1 | 3/2012 | Kono |
| 2018/0079130 A1 | 3/2018 | Okafuji et al. |
| 2019/0086798 A1 | 3/2019 | Nagai et al. |
| 2019/0101823 A1* | 4/2019 | Patel .............. G03F 7/0002 |

FOREIGN PATENT DOCUMENTS

JP 2021-044339 A 3/2021

OTHER PUBLICATIONS

Mulkens et al., High Order Field-to-Field Corrections for Imaging and Overlay to Achieve Sub 20-nm Lithography Requirements, Proc. SPIE 8683, Optical Microlithography XXVI, Apr. 12, 2013, San Jose, California, US.

* cited by examiner

*Primary Examiner* — Joshua D Zimmerman
(74) *Attorney, Agent, or Firm* — Daniel Ratoff

(57) ABSTRACT

A nanoimprint lithography template, a system for using the template and a method of using the template. The template may comprise a body having a front side with a shaping surface. The back side may have a central core-out that is located opposite the shaping surface. A first peripheral region may be bounded by: the central core-out; a first edge of the template; and a first set of two parallel perimeter lines orthogonal to the first edge and extending from the first edge to the central core-out. A first peripheral core-out may be positioned in the first peripheral region.

20 Claims, 10 Drawing Sheets

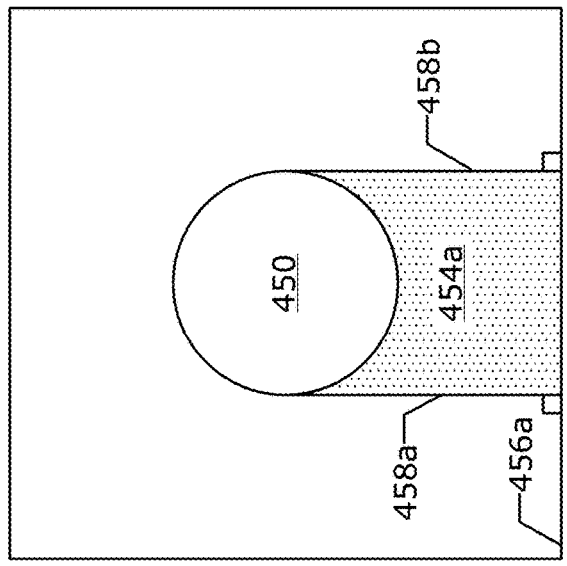
FIG. 4A
FIG. 4B
FIG. 4C
FIG. 4D
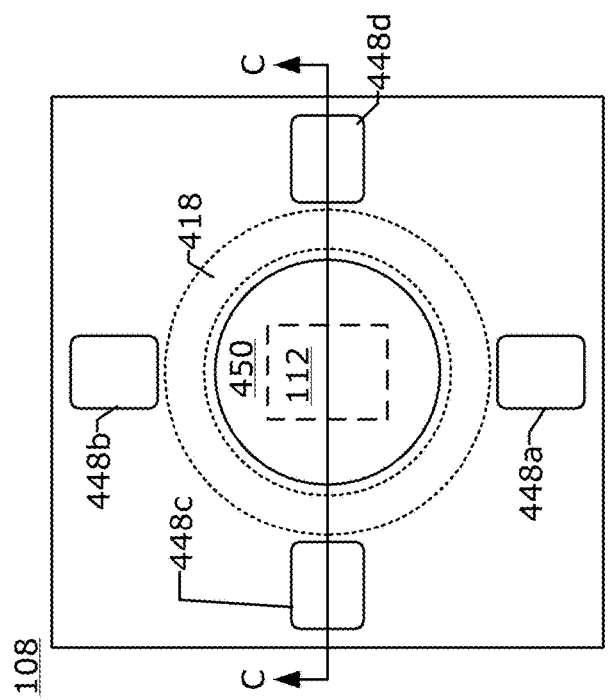
FIG. 4E
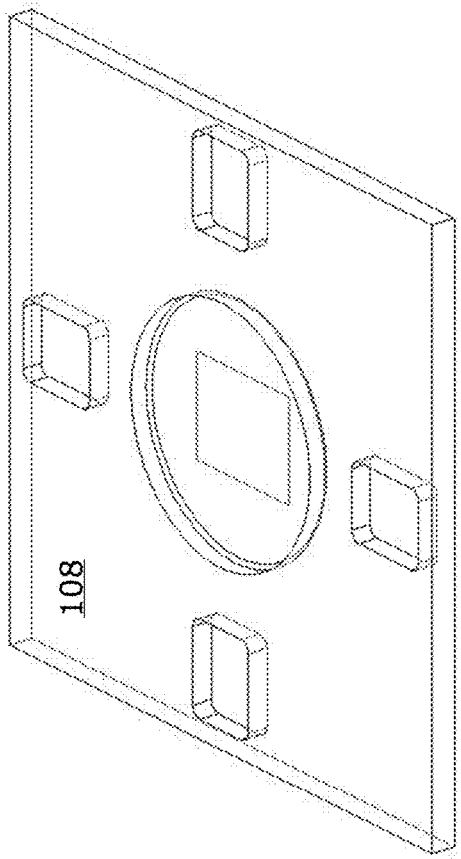
FIG. 4F

NANOIMPRINT LITHOGRAPHY TEMPLATE WITH PERIPHERAL POCKETS, SYSTEM OF USING THE TEMPLATE, AND METHOD OF USING THE TEMPLATE

BACKGROUND OF INVENTION

Technical Field

The present disclosure relates to photomechanical shaping systems (such as a Nanoimprint Lithography system and/or an Inkjet Adaptive Planarization system). In particular, the present disclosure relates to a template used in a Nanoimprint Lithography system and systems adapted to use the template.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The shaping process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer may then be subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

SUMMARY OF THE INVENTION

A first embodiment, may be a nanoimprint lithography template. The template may comprise a body having a front side with a shaping surface. The back side may have a central core-out that is located opposite the shaping surface. A first peripheral region may be bounded by: the central core-out; a first edge of the template; and a first set of two parallel perimeter lines orthogonal to the first edge and extending from the first edge to the central core-out. A first peripheral core-out may be positioned in the first peripheral region.

The first embodiment, may further comprise a set of two or more deformation contact areas on the first edge of the body. The first peripheral core-out may be positioned between a first subset of contact areas that includes an inner two of the set of two or more deformation contact areas.

In an aspect of the first embodiment the inner first subset of contact areas may be located between the first set of two parallel perimeter lines.

The first embodiment, may further comprise a plurality of peripheral core-outs including three additional peripheral core-outs and the first peripheral core-out. The plurality of peripheral core-outs may be arranged symmetrically around the central core-out.

In an aspect of the first embodiment sizes, shapes, and positions of the plurality of peripheral core-outs may be determined based on improvements of one or more distortion response metrics.

In an aspect of the first embodiment improvements of the one or more distortion response metrics includes minimizing a first distortion response metric $E_1$ as described by equation:

$$E_1(D_S) = \max_{i=B,T,L,R}(\max(f_{1,i}(D_S)) - \min(f_{1,i}(D_S)));$$

$$f_1(D_S) = \{f_{1,B}; f_{1,T}; f_{1,L}; f_{1,R}\}.$$

$D_S$ is a simple distortion of the template. $f_1(D_S)$ is a set of forces that when applied to template sidewalls of the template are predicted to produce the simple distortion ($D_S$). $f_{1,B}$ is a subset of forces in the set $f_1$ that are applied to a bottom side template sidewall of the template. $f_{1,T}$ is a subset of forces in the set $f_1$ that are applied to a top side template sidewall of the template. $f_{1,L}$ is a subset of forces in the set $f_1$ that are applied to a left side template sidewall of the template. $f_{1,R}$ is a subset of forces in the set $f_1$ that are applied to a right side template sidewall of the template.

In an aspect of the first embodiment the simple distortion ($D_S$) is a distortion of the template selected from a set of distortion metrics consisting of: x-magnification ($M_x$); y-magnification ($M_y$); skew ($S_k$); x-trapezoidal ($T_x$); and y-trapezoidal ($T_y$).

In an aspect of the first embodiment the set of forces $F_1$ may be predicted to produce the simple distortion $D_S$ based on one or more of: a set of experiments using a nanoimprint lithography shaping process; and a finite element simulation of the template.

In an aspect of the first embodiment improvements of the one or more distortion response metrics may include minimizing a second distortion response metric $E_2$ as described by equation:

$$E_2(D_S) = \max_{i=B,T,L,R}\left(\sum_i f_{1,i}(D_S)\right);$$

$$f_1(D_S) = \{f_{1,B}; f_{1,T}; f_{1,L}; f_{1,R}\}.$$

$D_S$ is a simple distortion of the template. $f_1(D_S)$ is a set of forces that when applied to template sidewalls of the template are predicted to produce the simple distortion ($D_S$). $f_{1,B}$ is a subset of forces in the set $f_1$ that are applied to a bottom side template sidewall of the template. $f_{1,T}$ is a subset of forces in the set $f_1$ that are applied to a top side template sidewall of the template. $f_{1,L}$ is a subset of forces in the set $f_1$ that are applied to a left side template sidewall of the template. $f_{1,R}$ is a subset of forces in the set $f_1$ that are applied to a right side template sidewall of the template.

In an aspect of the first embodiment improvements of the one or more distortion response metrics includes minimizing a third distortion response metric $E_3$ as described by equation:

$$E_3(D_S)=\Delta u_e(D_S)-A^*w(D_S).$$

$D_S$ is a simple distortion of the template. w is a set of weights that when multiplied by the null space basis force vectors matrix $\lambda$ to produce the set of forces F which when applied to the template sidewalls meet the constraints on the template and are predicted to produce the simple distortion $D_S$. A is a stiffness matrix of the template. $\Delta u_e$ the vector of distortions at discrete points in the pattern area 112 corresponding to the distortion $D_S$.

In an aspect of the first embodiment the stiffness matrix A may be determined based on one or more of: a set of experiments using a nanoimprint lithography shaping process; and a finite element simulation of the template.

In an aspect of the first embodiment improvements of the one or more distortion response metrics may include minimizing a statistical value of the third distortion response metric $E_3$.

In an aspect of the first embodiment the one or more distortion response metrics may include a first set of distortion response metrics and a second distortion response metric. The improvements of the one or more distortion response metrics may include: minimizing the first set of distortion response metrics; and reducing the second distortion response metric below a threshold.

In an aspect of the first embodiment plurality of peripheral core-outs are arranged on the back side.

The first embodiment, may further comprise a template chuck configured to hold the template; and a template magnification control system configured to apply a set of forces to sets of deformation contact areas on each of the template sidewalls of the template.

A second embodiment, may be a method of manufacturing an article. The method may comprise holding a template with a nanoimprint lithography template. The nanoimprint lithography template may comprise: a body having a front side with a shaping surface; and a back side having a central core-out that is located opposite the shaping surface; a first peripheral region bounded by: the central core-out; a first edge of the template; and a first set of two parallel perimeter lines orthogonal to the first edge and extending from the first edge to the central core-out; and a first peripheral core-out positioned in the first peripheral region. The method may further comprise shaping formable material on a substrate with the nanoimprint lithography template. The method may further comprise curing the formable material between the template and the substrate to form a shaped film. The method may further comprise processing the shaped film on the substrate so as to create the article of manufacture.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF THE FIGURES

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

FIGS. 4A-F are illustrations of an exemplary nanoimprint lithography template as used in embodiments.

Figure 1:
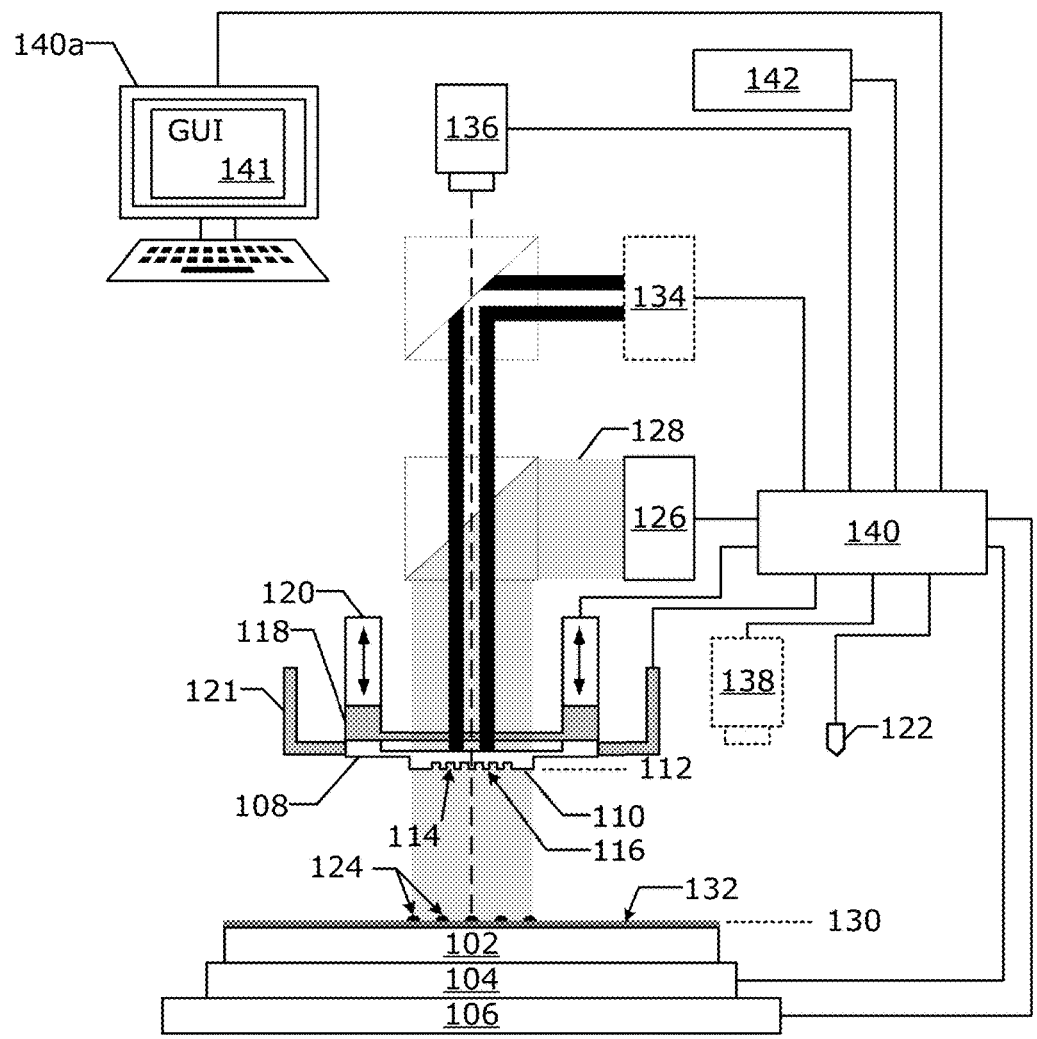
FIG. 1 is an illustration of an exemplary nanoimprint lithography system having a template with a mesa spaced apart from a substrate as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

It should be noted that the following embodiments are not intended to limit the scope of the appended claims. A plurality of features are described in the embodiments. However, not all the combinations of the plurality of features are necessarily essential to the present invention, and the plurality of features may arbitrarily be combined. The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). Reference to "one embodiment", "certain embodiments", "an embodiment", "an implementation", "an example", "alternative embodiment", or similar terms means that a particular feature, structure, element, or characteristic described in connection with the embodiment is included in at least one embodiment. Thus, the appearances of such phrases or in various places throughout are not necessarily all referring to the same embodiment. Furthermore, the particular features, structures, or characteristics may be combined in any suitable manner in one or more embodiments without limitation, unless otherwise stated.

DETAILED DESCRIPTION

The nanoimprinting lithography technique can be used to shape a film on a substrate from a formable material. The shaping process includes bringing a template into contact with the formable material. During the shaping process a plurality of fingers are used to distort the shaping process by compressing and pulling on the edges of the template. The plurality of fingers may apply forces to the sides of the template to correct for alignment and higher order distortions in the substrate and/or template. The amount of force required to achieve a desired distortion is proportional to the stiffness of the template. The correction range that a particular plurality of fingers is therefore strongly tied to the stiffness of the template which is dependent upon the geometry of the template. What is needed is a way to improve the correction range and/or reduce the force requirements.

Nanoimprint System (Shaping System)

FIG. 1 is an illustration of a nanoimprint lithography system 100 in which an embodiment may be implemented. The nanoimprint lithography system 100 is used to produce an imprinted (shaped) film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, $\theta$, $\psi$, and $\varphi$-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. The patterning surface 112, also known as a shaping surface, is the surface of the template that shapes the formable material 124. In an embodiment, the patterning surface 112 is planar and is used to planarize the formable material. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators (fingers) which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head 120 may be moveably coupled to a bridge. The imprint head 120 may include one or more actuators such as voice coil motors, piezoelectric motors, linear motor, nut and screw motor, etc., which are configured to move the template chuck 118 relative to the substrate in at least the z-axis direction, and potentially other directions (for example x, y, $\theta$, $\psi$, and $\varphi$-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (for example: a mixture that includes a polymerizable material; a liquid material that can be solidified or gelled by being exposed to actinic radiation) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a curing system that includes at least a radiation source 126 that directs actinic energy along an exposure path 128. The imprint head 120 and the substrate positioning stage 106 may be configured to position the template 108 and the substrate 102 in superimposition with the exposure path 128. The radiation source 126 sends the actinic energy along the exposure path 128 after the template 108 has contacted the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has contacted the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108; the separation of the template 108 from cured formable material; and can be used to keep track of the imprinting process. The field camera 136 may also be configured to measure interference fringes, which change as the formable material spreads 124 between the gap between the patterning surface 112 and the substrate surface 130.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatio-temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has contacted the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and the visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may include an imprint field atmosphere control system such as gas and/or vacuum system, an example of which is described in U.S. Patent Publication Nos. 2010/0096764 and 2019/0101823 which are hereby incorporated by reference. The gas and/or vacuum system may include one or more of pumps, valves, solenoids, gas sources, gas tubing, etc. which are configured to cause one or more different gases to flow at different times and different regions. The gas and/or vacuum system 36 may be connected to a first gas transport system that transports gas to and from the edge of the substrate 102 and controls the imprint field atmosphere by controlling the flow of gas at the edge of the substrate 102. The gas and/or vacuum system may be connected to a second gas transport system that transports gas to and from the edge of the template 108 and controls the imprint field atmosphere by controlling the flow of gas at the edge of the template 108. The gas and/or vacuum system may be connected to a third gas transport system that transports gas to and from the top of the template 108 and controls the imprint field atmosphere by controlling the flow of gas through the template 108. One or more of the first, second, and third gas transport systems may be used in combination or separately to control the flow of gas in and around the imprint field.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136, imprint field atmosphere control system, and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (for example, UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124, forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form a planar layer with a featureless patterning surface 112.

The imprinting process may be done repeatedly in a plurality of imprint fields (also known as just fields or shots) that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include mass velocity variation features (fluid control features) which are used to prevent extrusions from forming on imprint field edges. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mesa 110.

Template

Figure 2A:
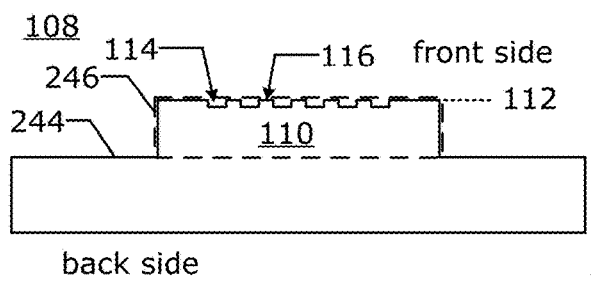
FIGS. 2A-B are illustrations of an exemplary template that may be used in an embodiment.
Figure 2B:
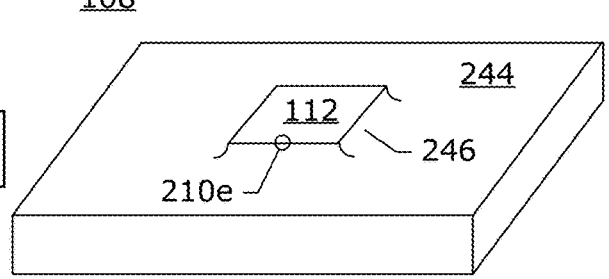

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

Imprinting Process

Figure 3:
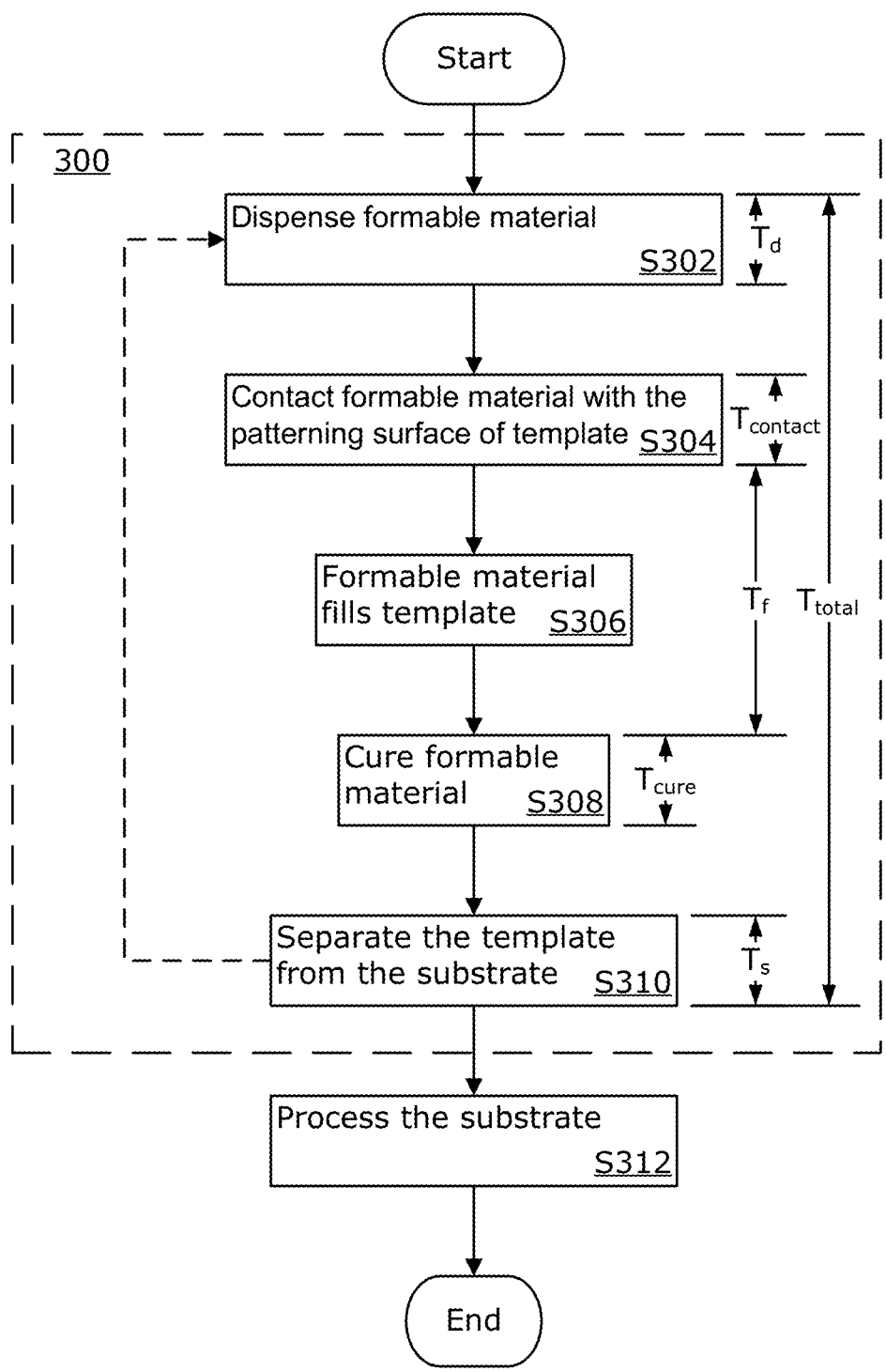
FIG. 3 is a flowchart illustrating an exemplary imprinting method as used in an embodiment.

FIG. 3 is a flowchart of a method of manufacturing an article (device) that includes an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control the imprinting process 300.

In an alternative embodiment, the imprinting process 300 is used to planarize the substrate 102. In which case, the patterning surface 112 is featureless and may also be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprinting field i (index i may be initially set to 1) of the substrate 102 to a fluid dispense position below the fluid dispenser 122. The substrate 102, may be divided into N imprinting fields, wherein each imprinting field is identified by an index i. In which N is a real integer such as 1, 10, 75, etc. $\{N \in \mathbb{Z}^+\}$. In a dispensing step S302, the processor 140 may cause the fluid dispenser 122 to dispense formable material onto an imprinting field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S302, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc. In an embodiment, the drop pattern may include only the volumes of the drops to be dispensed and the location of where to deposit the droplets.

After, the droplets are dispensed, then a contacting step S304 may be initiated, the processor 140 may cause one or both of the substrate positioning stage 106 and a template positioning stage to bring the patterning surface 112 of the template 108 into contact with the formable material 124 in imprint field i.

During a spreading step S306, the formable material 124 then spreads out towards the edge of the imprint field i and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112.

In a separation step S310, the processor 140 uses one or more of the substrate chuck 104, the substrate positioning stage 106, template chuck 118, and the imprint head 120 to separate the patterning surface 112 of the template 108 from the cured formable material on the substrate 102. If there are additional imprint fields to be imprinted, then the process moves back to step S302.

In an embodiment, after the imprinting process 300 is finished additional semiconductor manufacturing processing is performed on the substrate 102 in a processing step S312 so as to create an article of manufacture (for example a semiconductor device). In an embodiment, each imprint field includes a plurality of devices.

The further semiconductor manufacturing processing in processing step S312 may include etching processes to transfer a relief image into the substrate that corresponds to the pattern in the patterned layer or an inverse of that pattern. The further processing in processing step S312 may also include known steps and processes for article fabrication, including, for example, inspection, curing, oxidation, layer formation, deposition, doping, planarization, etching, formable material removal, dicing, bonding, packaging, and the like. The substrate 102 may be processed to produce a plurality of articles (devices).

Template with Peripheral Pockets

FIG. 4A is an illustration of a back side view of an exemplary template 108 that includes peripheral pockets 448a-d. The peripheral pockets 448a-d are positioned on the template to adjust how the shaping surface is deformed in response to forces applied to the template sidewalls. The template 108 may include a template holding region 418 where the template chuck 108 holds the template 108. The peripheral pockets 448a-d may be positioned so as to avoid the template holding region 418. The exemplary template 108 also include a central core-out 450 positioned above the shaping surface 112 on the mesa 110. The shaping surface 112 is shown with dashed lines as it is not visible from the back side. The central core-out 450 improves the ability to bow out the template 108 by applying pressure to a chamber (shown in FIG. 1) formed by the template chuck and the central core-out 450 as described in US Patent Publication No. 2008/0160129-A1 which is incorporated by reference herein. FIG. 4B is a side view of the template 108 in which the hidden peripheral pockets 448a-d and the central core-out 450 are shown with dashed lines. FIG. 4C is an illustration of section view along section line C-C in FIG. 4A illustrating the central core-out 450 above the mesa 110 and peripheral pockets 448c and 448d. FIG. 4D is an illustration of contact areas 452a-d on the template 108 which mag fingers of the template magnification control system 121 may apply a positive force to squeeze the template edges 456 or a negative force to pull on the template edges 456. In an embodiment, the mag fingers do not pull on the template edges and instead only apply positive forces to squeeze the template edges 456. The template 108 may include a set of two or more contact areas that is associated with each of the template sidewalls. Each of the peripheral pockets 448 may be located between two inner contact areas that are a subset of the set of two or more contact areas. The two inner contact areas may be located between the perimeter lines 458.

Each of the peripheral pockets are positioned in a peripheral region 454 of the template 108. Each peripheral region 454 is bounded by the central core-out 450 and a template edge 456. The template edges 456 are the intersection lines between the recessed surface 244 and the template sidewalls. The template sidewalls connect the recessed surface 244 to a backside surface of the template. Each peripheral region may also be bounded by a first set of perimeter lines 458. Each of the perimeter lines 458 is a straight line segment that connects a template edge 456 to the central core-out 450. Each of the perimeter lines 458 is orthogonal to a template edge 456. Each of the perimeter lines 458 may be tangent to the central core-out 450. Each of the perimeter lines 458 may be the longest straight segment, that is orthogonal to the template edge 456 and is connected to the central core-out 450. FIG. 4E is an illustration of a particular peripheral region 454a of the template 108. FIG. 4F is a three dimensional illustration of template 108 as viewed from the backside with the mesa 112 shown for illustration purposes only.

The peripheral pockets 448 may be arranged so that the template has 4-fold rotational symmetry (C4) and/or 4 lines of reflection symmetry. In an alternative embodiment, the template 108 has n template sidewalls, n template edges and n peripheral pockets 448 are arranged to have an n-fold rotational symmetry. The template 108 may have a square planar shape as illustrated in the figures or may have a rectangular, polygon, regular polygon, or circular shape. The template 108 may have beveled corners or rounded corners between adjacent template edges. The n template edges do not include these corners.

Adding peripheral pockets 448 to the template 108 reduces the stiffness of the template 108. In the present application, the stiffness of the template can be understood as the magnitude of distortion in patterned area 112, in response to forces applied to edges of the template. For example, a magnitude of distortion may be the average strain in the patterned area. The stiffness may be represented by a single parameter, a set of parameters, or as a function of a set of forces. The arrangement of the peripheral pockets 448 allows the stiffness of the template to be reduced in a selective manner. In an embodiment, the overall stiffness of the template 108 is more evenly distributed across the length of the template. In an embodiment, the peripheral pockets 448 are arranged to reduce the variation of the stiffness relative to forces applied to the template sidewalls. This reduction in variation allows the amount of magnification to be increased or a reduction in the force requirements from each of the fingers. In an embodiment, the depth of the central core-out 450 is the same as the peripheral pockets 448, this makes fabrication easier. In an embodiment, the peripheral pockets 448 are located on the backside of the template, so as to not affect the shaping process 300. For example, peripheral pockets 448 on the backside do not interfere with the flow of gas between the recessed surface 244 of the template 108 and the substrate surface 130.

Template Magnification Control System

Figure 5A:
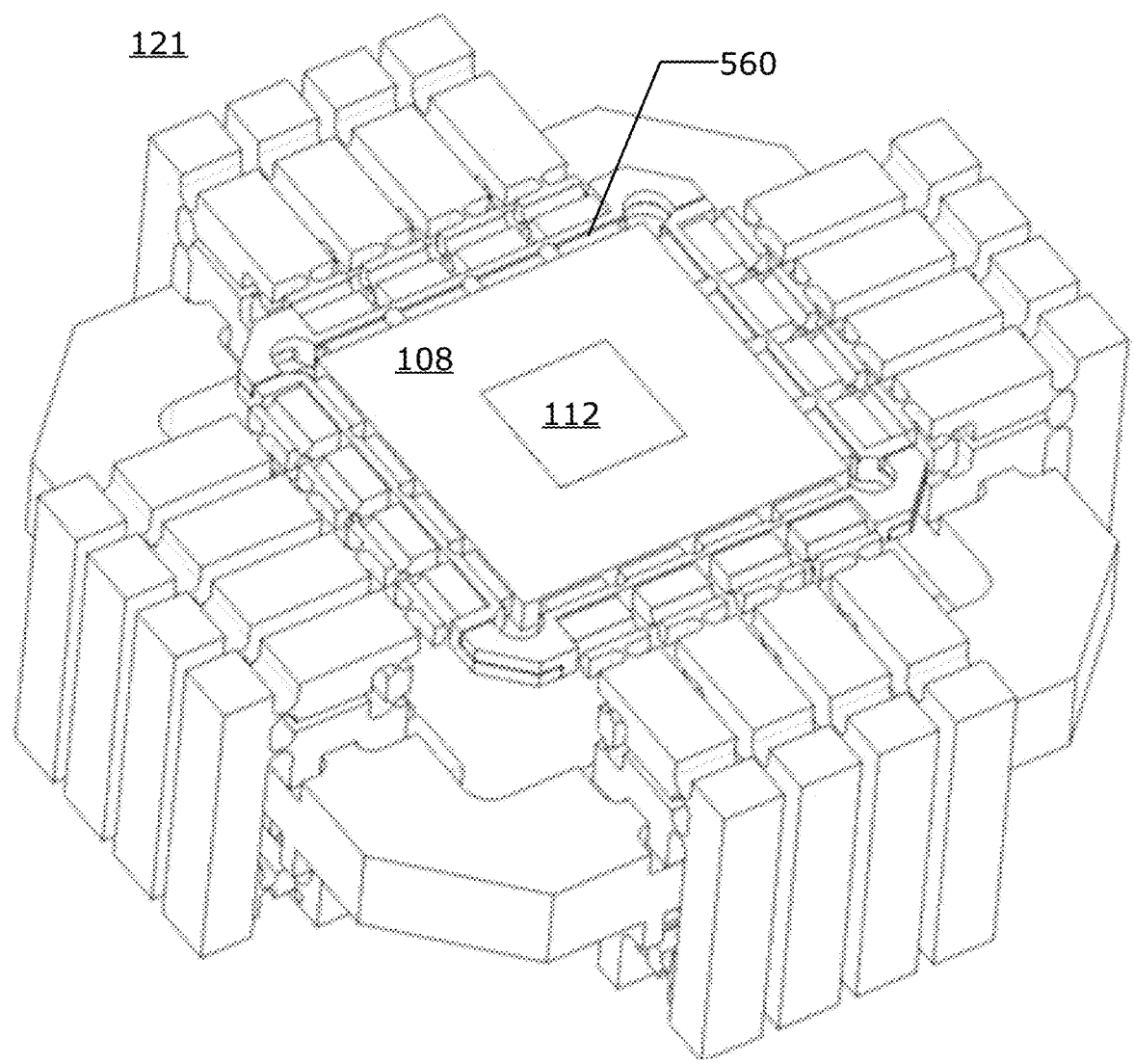
FIG. 5A is an illustration of an exemplary template magnification control system that may be used in an embodiment.

FIG. 5A is an illustration of an exemplary template magnification control system 121 that includes an actuator sub-assembly that is configured to subject template 108 to compressive forces as described in US Patent Publication No. 2005/0270516-A1 which is hereby incorporated by reference. The template magnification control system 121 may include a plurality of fingers 560 (for example 16 as illustrated in FIG. 5A) which apply direct pressure to the template sidewalls.

Each finger 560 is individually addressable and can apply a force $f_i$ to the template sidewall that is adjustable in both magnitude and time. Each finger 560 may be a magnification control actuator and/or attached to a magnification control actuator via one or more linkages, lever arms, bodies, etc. Each magnification control actuator may be one of: a pneumatic actuator; a piezo-electric actuator; a magneto-strictive actuator; shape memory alloy; nut and screw motor; a voice coil actuator; etc. Each finger 560 may receive information from the processors 140 instructing each finger 560 to provide a specific amount of force at a specific time. The information may take the form of: a digital signal; an analog signal; a voltage signal a pneumatic signal; or a current signal.

Figure 5B:
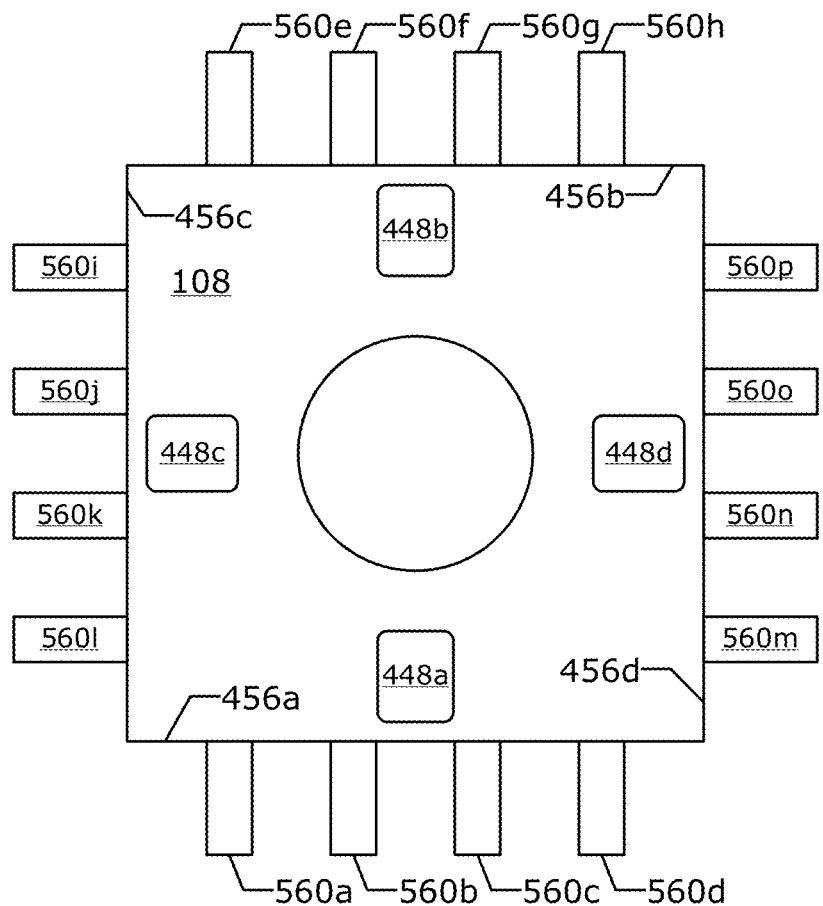
FIGS. 5B-D are illustrations of an exemplary nanoimprint lithography template along with a portion of the exemplary template magnification control system that may be used in an embodiment.

FIG. 5B shows an exemplary set of 16 fingers 560a-p and their positions relative to the peripheral pockets 448 of the template 108. For example, a set of 4 fingers 560a-d are in contact with the template sidewall along template edge 456a. The pocket 448a is positioned between two contact areas of finger 560b and finger 560c so as to not affect the force transmission from these fingers to the patterned area 112. The pocket 448a is also positioned such that it reduces the stiffness of the template 108, as seen in the force path of fingers 560l and 560m. This arrangement of pockets is designed to primarily reduce the stiffness of the template as seen by the outer pair of fingers while not substantially affecting the stiffness as seen by the inner pair of fingers.

Figure 5C:
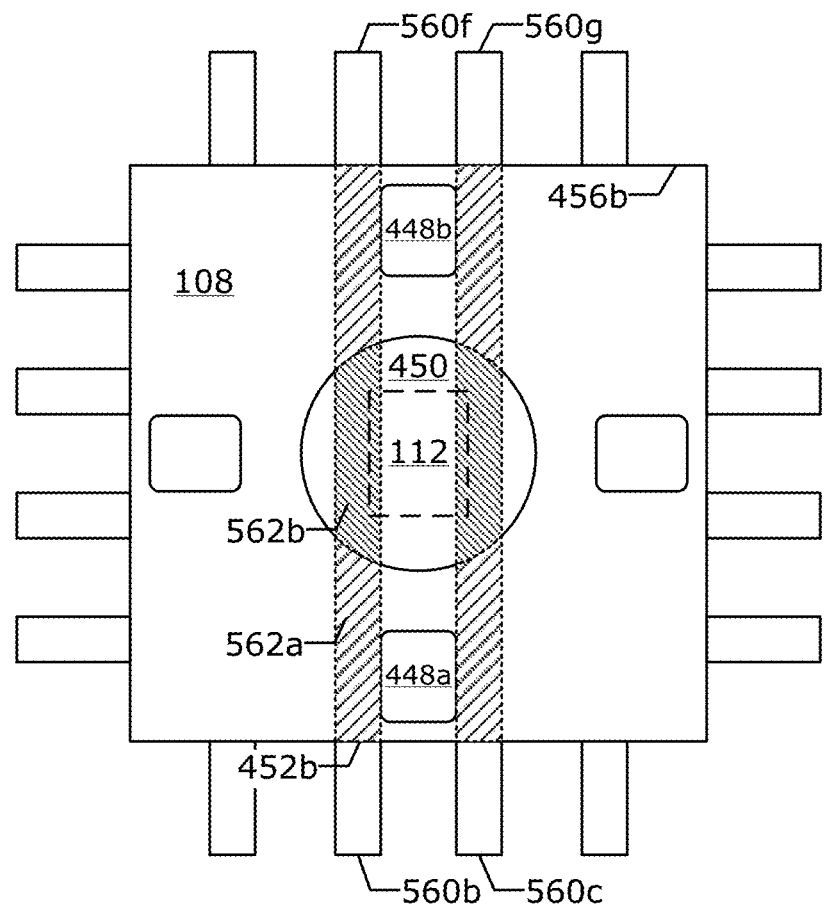

For example, as illustrated in FIG. 5C the peripheral pocket 448a is positioned so that it has minimal impact on the stiffness of template with respect to the inner fingers 560b, 560c, 560f, and 560g. The stiffness of the template with respect to the inner fingers is proportional to the average thickness of the template in the region of the template that is orthogonal to the contact area 452. The inner finger 560b applies a force to the contact area 452b on template edge 456a. The amount of strain that the shaping surface 112 experiences due to the inner finger 560b is influenced by a first region 562a that has the full thickness of the template 108 and a second region 562b that has a thickness of the central core-out 450 that is thinner than the full thickness of the template 108. Likewise, for inner fingers 560c, 560f, 560g, 560j, 520k, 560o, and 560n. While, adjacent regions do have some impact, the applicant has found that the impact is relatively small.

Figure 5D:
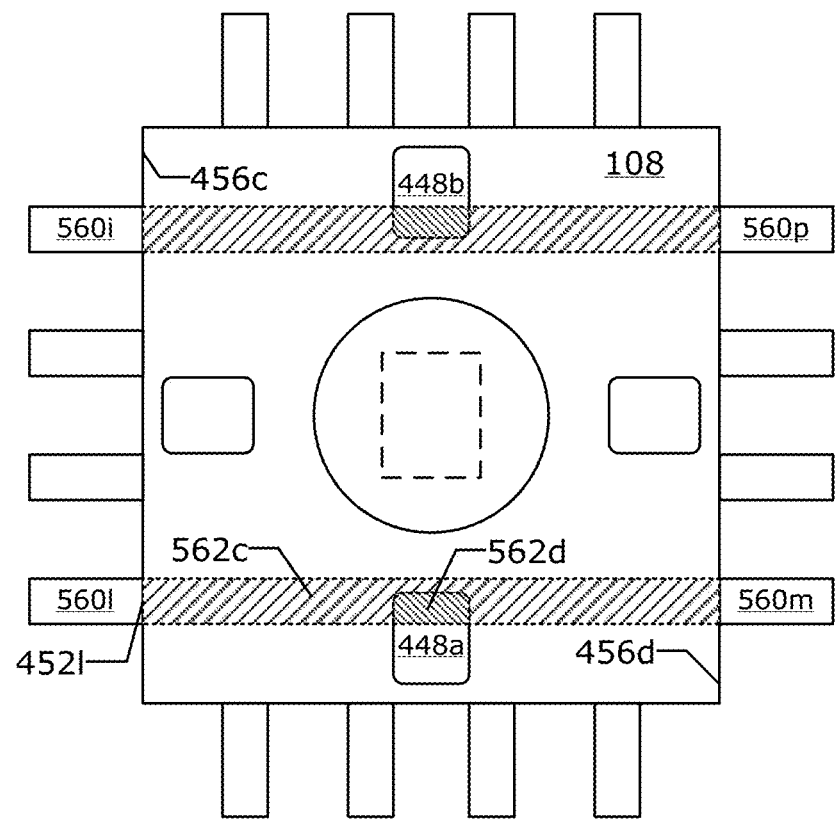

FIG. 5D illustrates how the peripheral pocket 448a reduces the stiffness due to forces applied by the outer fingers. For example, the outer finger 560l applies a force to the contact area 452l on the template edge 456c. The applicant has found that the amount of strain that the shaping surface 112 experiences due to the outer finger 560c is influenced by a third region 562c that has the full thickness of the template 108 and a fourth region 562d has a thickness of the peripheral pocket 448a that is thinner than the full thickness of the template 108. The applicant has found that the peripheral pocket 448a when properly positioned can have a significant impact on the stiffness of the template relative to forces applied by fingers 560 at the outer edge of the template. Likewise, for outer fingers 560a, 560d, 560e, 560h, 520i, 560m, and 560p.

A properly positioned peripheral pocket 448 is positioned in an outer force path of at least one outer finger while also being out of the inner force path of all the inner fingers. The force path of a finger is the region 562 of the template that is orthogonal to the contact area 452 on the template edge 456 associated with the finger.

Force Combination Determination Method

The substrate 102 may have an underlying pattern and may include a plurality of overlay registration features. The substrate 102 may be measured to determine the underlying pattern's deviation from an ideal underlying pattern. This deviation may be measured by measuring the positions of the plurality of overlay registration features to obtain a set of overlay vectors that represent the deviation of the underlying pattern. The set of N overlay vectors (which may be over a hundred values) represents the local distortion across an imprint field.

In this application, the following notation is used: bold letters are used in reference to sets, vectors, matrices, and/or tensors; subscripts are used to distinguish similar items; an H superscript ($^H$) is used to represent a conjugate transpose; a T superscript ($^T$) is used to represent a matrix transpose; a minus one superscript ($^{-1}$) is used to represent an inverse matrix and a star (*) between elements used to represent multiplication.

A distortion model may also be used to describe variation of the distortion across the imprint field as a function of a set of distortion metrics which is then fitted to the set of overlay vectors. The distortion model may include one or more equations and/or methods. An exemplary set of distortion metrics D may include: x-offset ($O_x$); y-offset ($O_y$); rotational offset ($\theta$); x-magnification ($M_x$); y-magnification ($M_y$); skew ($S_k$); x-trapezoidal ($T_x$); y-trapezoidal ($T_y$) and may include other higher order distortions (D={$O_x$; $O_y$; $\theta$; $M_x$; $M_y$; $S_k$; $T_x$; $T_y$}. The errors ($O_x$; $O_y$; $\theta$) refer to the measured shift and rotation of the underlying pattern in the entire imprint field relative to the ideal position of the underlying pattern. The magnification error ($M_x$; $M_y$) refers to the shrinkage or expansion of the underlying pattern compared to the ideal underlying pattern. The skew error ($S_k$) refers to a skewing of the underlying pattern with respect to the ideal pattern, such that adjacent sides of the imprint field are not orthogonal and opposing sides are parallel, such that a rectangular field is distorted into a parallelogram. The trapezoidal error ($T_x$; $T_y$) refers to a trapezoidal shape of the underlying pattern with respect to the ideal pattern, such that adjacent sides of the field are not orthogonal and opposing sides are not parallel, such that a rectangular field is distorted into a trapezoid. The set of distortion metrics is: x-magnification ($M_x$); y-magnification ($M_y$); skew ($S_k$); x-trapezoidal ($T_x$); and y-trapezoidal ($T_y$).

The distortion model may be used to describe the relative distortion of a template to an ideal template, or a template pattern to an underlying layer pattern. The distortion model may then be used to determine how much the template 108 needs to be distorted by the template magnification control system 121 so as to minimize the overlay error between the template 108 and the underlying layer of the substrate.

In an embodiment, a set of desired distortion metrics D may be determined based on one or more experiments such as: nanoimprint test runs; and/or surface analyses of the template and substrate. These experiments will be used to generate a set of p desired displacements $\Delta u_d$={$\Delta x_1$, $\Delta y_1$; $\Delta x_2$, $\Delta y_2$; . . . $\Delta x_p$, $\Delta y_p$} associated with a set of positions $u_d$={$x_1$, $y_1$; $x_2$, $y_2$; . . . $x_p$, $y_p$}. Each point in the set of positions u are within an imprint field on a wafer and are associated with a position on the shaping surface 112. The set of distortion metrics D may be generated from $\Delta u_d$ and $u_d$. The template 108 is distorted by applying a set of forces f={$f_1$; $f_2$ . . . $f_{16}$} with the fingers 560 so that the shaping surface 112 is distorted. The set of forces f may be divided into subsets (for example 4 as described in equation (1) below or 1 for each edge of the template) f={$f_B$; $f_T$; $f_L$; $f_R$}. The set of forces are also limited to between a minimum value $f_{min}$ and a maximum value $f_{max}$. The subsets of forces here are exemplary and would change depending on the number of edges and the number of actuators, such that there is one subset for each template sidewall and the number of forces are associated with the number of actuators that can apply forces to the actuator.

$$f_B = \{f_1; f_2; f_3; f_4\}$$

$$f_T = \{f_5; f_6; f_7; f_8\}$$

$$f_L = \{f_9; f_{10}; f_{11}; f_{12}\}$$

$$f_R = \{f_{13}; f_{14}; f_{15}; f_{16}\}$$

$$f_{min} \leq f \leq f_{max} \tag{1}$$

The set of forces f may also be subject to constraints which restrict lateral motion and rotation as described in equation (2) below. Once the contact areas 452 are set, each moment $M_i$ may be determined to be proportional to a force $f_i$.

$$\sum_{i \in f_B} f_i - \sum_{i \in f_T} f_i = 0 \tag{2}$$

$$\sum_{i \in f_R} f_i - \sum_{i \in f_L} f_i = 0$$

$$\sum_{i \in f} M_i = 0$$

Equations (2) may be described in matrix form with a matrix K, as described in U.S. Pat. No. 7,768,624 and as represented by equation (3). These constraints allow for the calculation of the null space of the matrix K to be represented by a null space basis force vectors matrix $\lambda$, which maybe a set of 13 orthonormal 1×16 null space basis force vectors $\lambda = \{\lambda_1; \lambda_2 \ldots \lambda_{13}\}$. Each $\{\lambda_i\}$ is a force combination of the 16 fingers that satisfies the constraints in equation (2). A set of 13 weights w may be used to represent a set of forces f that complies with equation (2) as shown in equation (3b). This methodology can be expanded to cover systems with any number of forces and constraints.

$$K * f = 0 \tag{3a}$$

$$f = w * \lambda \tag{3b}$$

A set of (for example 13) of force combinations $\lambda$ are chosen and distortions are applied to a test template and used during a test shaping process 300. The effect of these distortions is then measured to generate a set experimental distortions $\Delta u_e$ at a set of measurement positions $u_e$ on an imprint field that are associated with positions on the shaping surface 112 of the template. This set of distortions from the force combinations is referred to as the stiffness matrix A. The matrix A can also be generated from a numerical model of the template for example by finite element analysis. The deformation of the shaping surface 112 can therefore be represented by a matrix equation (4) shown below.

$$A * w = \Delta u_e \tag{4}$$

The processors 141 can perform a force combination determination method to determine the weights w of the force combinations $\lambda$ that generates the set of desired displacements $\Delta u_d$ and/or the desired set of distortion metrics $D_d$. An example of how the weights of force combinations $\lambda$ may be determined is described in U.S. Pat. No. 7,768,624 which is hereby incorporated by reference. The force combination determination method may include non-linear or linear optimization routines. The force combination determination method may include the determination of the stiffness matrix A that is generated based on the mechanical and material properties of the template 108. A finite element analysis package (for example Creo Simulate by PTC Inc., 121 Seaport Blvd, Ste 1700, Boston, MA 02210) may be used to generate the stiffness matrix A; the set of distortion metrics D and/or the set of desired displacements $\Delta u_d$. The stiffness matrix A may also be generated based on experiments as described above.

The template 108 is not going being deformed exactly as desired in response to the force combinations $\lambda$. This error may be characterized by the residual error e as described in equation (5) below.

$$e = \Delta u_d - A * w \tag{5}$$

Distortion Response Metrics for Optimizing Position of Peripheral Pockets

The applicant has found it useful to create distortion response metrics to allow different template designs to be compared. One useful distortion response metric is to compare the performance of a template under different target deformations. For example, a first set of desired deformations $\Delta u_1$ may be associated with a simple distortion $D_S$ in which x-magnification ($M_x$) is 1 part per million (ppm) while all the other distortions are zero. A first set of weights $w_1$ are determined based on equation (4) which can be used to generate equation (6a) to determine a first set of forces when the stiffness matrix A is square. When the stiffness matrix A and the force combinations $\lambda$ are not square but include all real elements then equation (6b) may be used. A simple distortion is a distortion of the template in which there is only one distortion selected from the subset of distortion metrics consisting of: x-magnification ($M_x$); y-magnification ($M_y$); skew ($S_k$); x-trapezoidal ($T_x$); and y-trapezoidal ($T_y$).

$$w_1(D_S) = A^{-1} * \Delta u_1(D_S) \tag{6a}$$

$$f_1(D_S) = w_1 * \lambda$$

$$w_1(D_S) = \left( \left( A^T * A \right)^{-1} A^T \right) * \Delta u_1(D_S) \tag{6b}$$

$$f_1(D_S) = w_1 * \lambda$$

Once the first set of forces are determined, the first set of forces $f_1$ is divided into subsets of forces, one for each edge (for example for four edges $f_{1,B}$; $f_{1,T}$; $f_{1,L}$; $f_{1,R}$) A first distortion response metric $E_1$ may be calculated using equation (7) below. The first distortion response metric is a measure of the maximum range of the forces that are required for each edge. The template 108 is designed to minimize the first distortion response metric $E_1$ for a given simple distortion such as the simple distortion of $M_x = 1$ ppm.

$$E_1(D_S) = \max_{i = B,T,L,R} (\max(f_{1,i}(D_S)) - \min(f_{1,i}(D_S))) \tag{7}$$

$$f_1(D_S) = \{f_{1,B}; f_{1,T}; f_{1,L}; f_{1,R}\}$$

A second distortion response metric $E_2$ may be calculated using equation (8) below. The second distortion response metric is a measure of the absolute total force that is applied to each edge. The applicant has found that it is useful to minimize the absolute total force applied to each edge.

$$E_2(D_S) = \max_{i=B,T,L,R}\left(\sum_i |f_{1,i}(D_S)|\right) \quad (8)$$

A third distortion response metric $E_3$ may be calculated using equation (9) below which is a measure of the residual error (similar to equation (5)) in which a set forces $(w(D_S)*\lambda)$ are applied based on the desired distortion $(D_S)$. The effect of these the set of forces is then measured to generate a set experimental distortions $\Delta u_e$ at a set of measurement positions $u_e$ on an imprint field that are associated with positions on the shaping surface 112 of the template. In an alternative embodiment, the values $\Delta u_e$ may be determined using a finite element method as described above.

$$E_3(D_S) = \Delta u_e(D_S) - A*w(D_S) \quad (9)$$

The third distortion response metric $E_3$ is a vector field that represents how effective the set of forces were at distorting the template to achieve the desired distortions as measured in nanometers (nm). The third distortion response metric $E_3$ may also be described by one or more statistical values which describe their effectiveness. Exemplary statistical values include: the maximum magnitude of each vector in $E_3$; the maximum magnitude of each component in $E_3$; the median value of $E_3$; the absolute mean+3*standard deviation of $E_3$ as described in equation (9) below.

The third distortion response metric $E_3$ may also be transformed to a fourth distortion response metric $F_4$ that removes displacement errors ($O_x$; $O_y$; $\theta$). The third and fourth distortion response metrics ($E_3$, $E_4$) may also be transformed by removing outliers which may represent measurement errors or other errors that are not associated with the template magnification control process.

The size and shape of the peripheral pockets 488 in template 108 may be optimized to minimize an objective function of the distortion response metrics described above. In an embodiment, the size, shape, and position of the peripheral pockets 488 in template 108 are optimized by keeping the third and/or fourth metric ($E_3$, $E_4$) below an effectiveness threshold while reducing the values of the first and second metrics ($E_1$, $E_2$).

Equations (9) below are examples of statistical representatives $E_{5,x}$ and $E_{5,y}$ of the third distortion response metric $E_3$. The third distortion response metric $E_3$ may be a set of p vectors $\{E_{3,1}, E_{3,2}, \ldots E_{3,i}, \ldots E_{3,p}\}$. Each vector $E_{3,i}$ may be represented by two components $E_{3,i,x}$ and $E_{3,i,y}$. The statistical representatives $E_6$ may also be calculated in terms of the fourth metric by replacing $E_3$ with $E_4$ in equations (10a-b) below.

$$E_{5,x} = |\overline{E}_{3,i,x}| + 3\sqrt{\frac{1}{p}\sum_{i=1}^{p}(E_{3,i,x} - \overline{E}_{3,i,x})^2} \quad (10a)$$

$$E_{5,y} = |\overline{E}_{3,i,y}| + 3\sqrt{\frac{1}{p}\sum_{i=1}^{p}(E_{3,i,x} - \overline{E}_{3,i,y})^2} \quad (10b)$$

Forces Required for Exemplary Embodiment

Figure 6A:
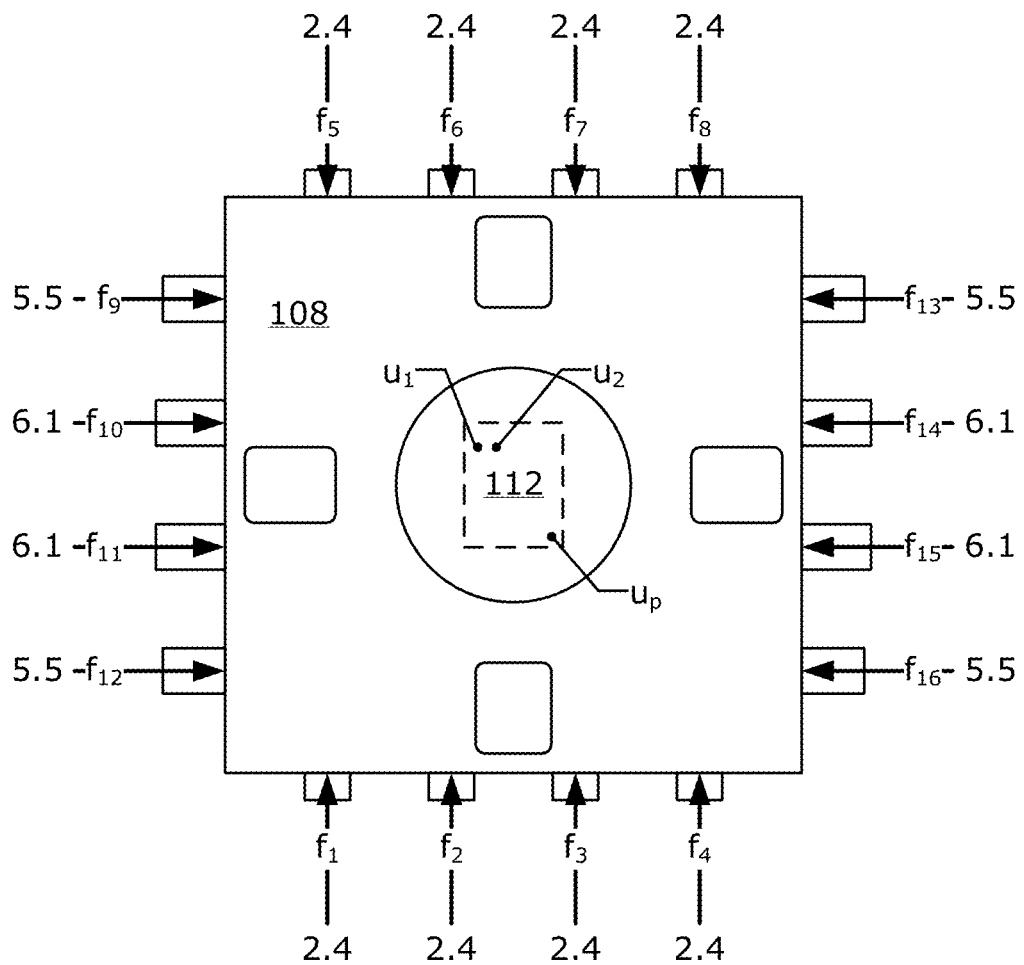
FIGS. 6A-C are illustrations of forces applied to an exemplary nanoimprint lithography template and comparative examples.

The applicant has evaluated template 108 with peripheral pockets 488 and evaluated it's performance as illustrated in table 1 below and illustrated in FIG. 6A. The forces listed in Table 1 were determined using a finite element model of the template 108. The second column of Table 1 identifies the force label associated with an actuator in the exemplary embodiment. The first column of Table 1 identifies the subset of forces associated with a template sidewall of a template in an exemplary embodiment. The third column of Table 1 describes the amounts of forces that actuators would supply to distort the template such that the distortion $D_S$ is $M_x=1$ ppm. The fourth column of Table 1 describes the amounts of forces that actuators would supply to distort the template such that the distortion $D_S$ is $M_y=1$ ppm. Table 1 also includes the metrics E which were calculated to determine the performance of the exemplary template under these test conditions.

TABLE 1

| | | Forces (N) $D_s$ | | | | |
|---|---|---|---|---|---|---|
| subset | Force Label | $M_x = 1$ ppm | $M_y = 1$ ppm | $M_x = 4$ ppm | $M_y = 4$ ppm | $M_x = M_y = 4$ ppm |
| $F_B$ | $F_1$ | 2.4 | 5.4 | 9.6 | 21.5 | 31.1 |
| | $F_2$ | 2.4 | 6.2 | 9.8 | 24.9 | 34.6 |
| | $F_3$ | 2.4 | 6.2 | 9.8 | 24.9 | 34.6 |
| | $F_4$ | 2.4 | 5.4 | 9.6 | 21.5 | 31.1 |
| $F_T$ | $F_5$ | 2.4 | 5.4 | 9.6 | 21.5 | 31.1 |
| | $F_6$ | 2.4 | 6.2 | 9.8 | 24.9 | 34.6 |
| | $F_7$ | 2.4 | 6.2 | 9.8 | 24.9 | 34.6 |
| | $F_8$ | 2.4 | 5.4 | 9.6 | 21.5 | 31.1 |
| $F_R$ | $F_9$ | 5.5 | 2.1 | 21.8 | 8.6 | 30.4 |
| | $F_{10}$ | 6.1 | 2.6 | 24.4 | 10.3 | 34.8 |
| | $F_{11}$ | 6.1 | 2.6 | 24.4 | 10.3 | 34.8 |
| | $F_{12}$ | 5.5 | 2.1 | 21.8 | 8.6 | 30.4 |
| $F_L$ | $F_{13}$ | 5.5 | 2.1 | 21.8 | 8.6 | 30.4 |
| | $F_{14}$ | 6.1 | 2.6 | 24.4 | 10.3 | 34.8 |
| | $F_{16}$ | 6.1 | 2.6 | 24.4 | 10.3 | 34.8 |
| | $F_{16}$ | 5.5 | 2.1 | 21.8 | 8.6 | 30.4 |
| E | $E_1$ | 0.6 | 0.8 | 2.6 | 3.3 | 4.4 |
| | $E_2$ | 23.2 | 23.2 | 92.6 | 92.8 | 131.4 |
| | $E_{5,x}$ | | | 0.29 nm | 0.20 nm | |
| | $E_{5,y}$ | | | 0.21 nm | 0.47 nm | |

Forces Required for Comparative Examples

Figure 6B:
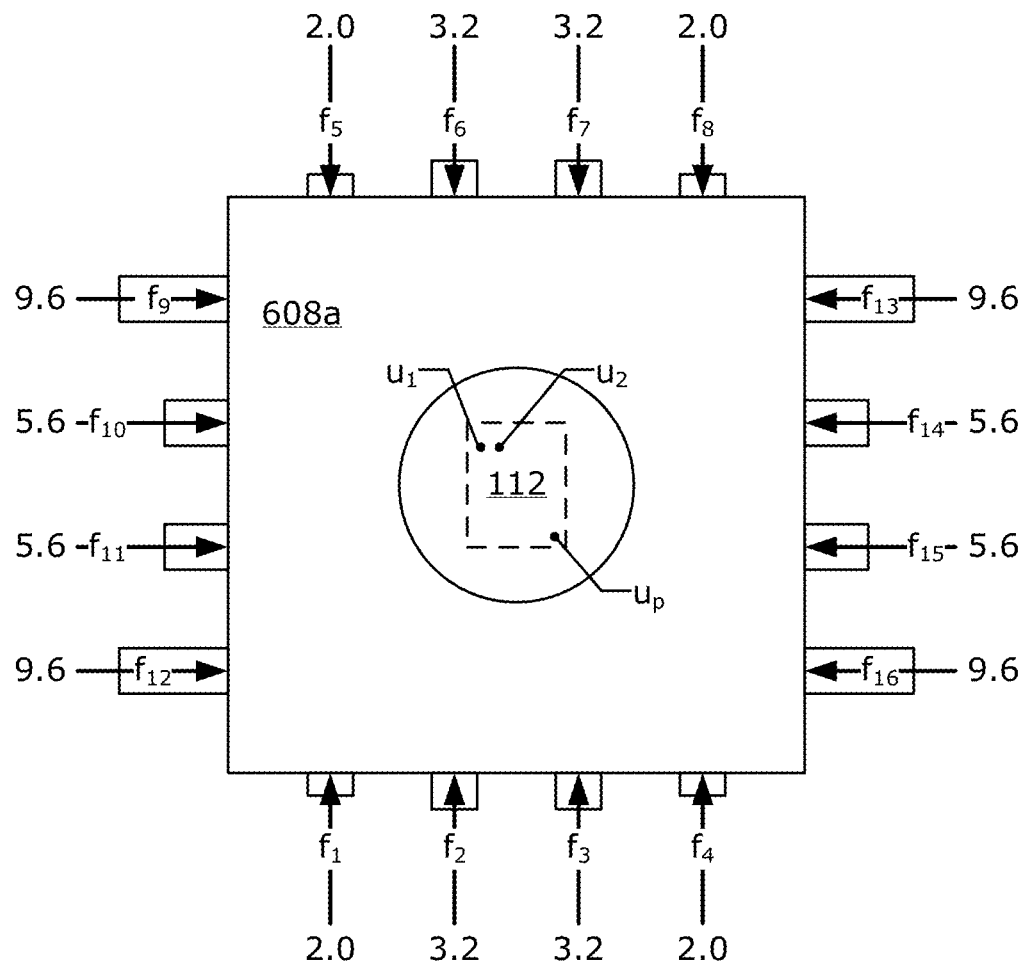

The applicant has evaluated a prior art template 608a without pockets and evaluated it's performance as illustrated in table 2 below and illustrated in FIG. 6B, the analysis was the same as in Table 1.

TABLE 2

| | | Forces (N) $D_s$ | | | | |
|---|---|---|---|---|---|---|
| subset | Force Label | $M_x = 1$ ppm | $M_y = 1$ ppm | $M_x = 4$ ppm | $M_y = 4$ ppm | $M_x = M_y = 4$ ppm) |
| $F_B$ | $F_1$ | 2 | 9.6 | 7.8 | 38.4 | 46.2 |
| | $F_2$ | 3.2 | 5.6 | 12.8 | 22.4 | 35.3 |
| | $F_3$ | 3.2 | 5.6 | 12.8 | 22.4 | 35.3 |
| | $F_4$ | 2 | 9.6 | 7.8 | 38.4 | 46.2 |
| $F_T$ | $F_5$ | 2 | 9.6 | 7.8 | 38.4 | 46.2 |
| | $F_6$ | 3.2 | 5.6 | 12.8 | 22.4 | 35.3 |
| | $F_7$ | 3.2 | 5.6 | 12.8 | 22.4 | 35.3 |
| | $F_8$ | 2 | 9.6 | 7.8 | 38.4 | 46.2 |
| $F_R$ | $F_9$ | 9.6 | 1.9 | 38.4 | 7.7 | 46.2 |
| | $F_{10}$ | 5.6 | 3.2 | 22.4 | 12.9 | 35.3 |
| | $F_{11}$ | 5.6 | 3.2 | 22.4 | 12.9 | 35.3 |
| | $F_{12}$ | 9.6 | 1.9 | 38.4 | 7.7 | 46.2 |
| $F_L$ | $F_{13}$ | 9.6 | 1.9 | 38.4 | 7.7 | 46.2 |
| | $F_{14}$ | 5.6 | 3.2 | 22.4 | 12.9 | 35.3 |
| | $F_{16}$ | 5.6 | 3.2 | 22.4 | 12.9 | 35.3 |
| | $F_{16}$ | 9.6 | 1.9 | 38.4 | 7.7 | 46.2 |
| E | $E_1$ | 4 | 4 | 16.0 | 15.9 | 10.9 |
| | $E_2$ | 30.4 | 30.4 | 121.7 | 121.6 | 162.9 |
| | $E_{5,x}$ | | | 0.29 nm | 0.21 nm | |
| | $E_{5,y}$ | | | 0.23 nm | 0.45 nm | |

Figure 6C:
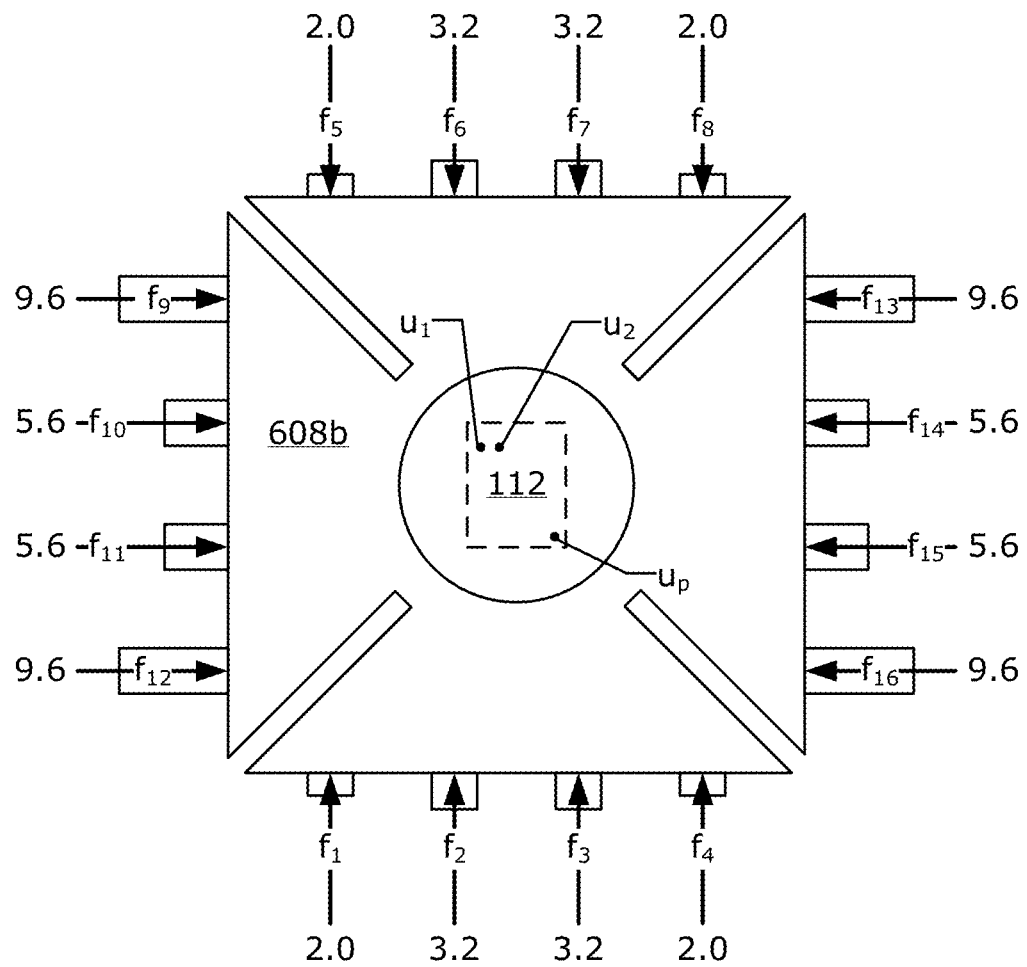

The applicant has evaluated a prior art template 608b without peripheral pockets having slots that is described in Japanese Patent Publication No. 2021-044339-A1, and evaluated its performance as illustrated in Table 3 below and illustrated in FIG. 6C, the analysis was the same as in Table 1. Negative force values indicate a pulling force on the template edge 456.

TABLE 3

| Force subset | Label | Forces (N) $D_S$ | | |
|---|---|---|---|---|
| | | $M_x = 4$ ppm | $M_y = 4$ ppm | $M_x = M_y = 4$ ppm |
| $F_B$ | $F_1$ | 10.8 | −15.7 | −4.9 |
| | $F_2$ | 4.5 | 34.7 | 39.2 |
| | $F_3$ | 4.5 | 34.7 | 39.2 |
| | $F_4$ | 10.8 | −15.7 | −4.9 |
| $F_T$ | $F_5$ | 10.8 | −15.7 | −4.9 |
| | $F_6$ | 4.5 | 34.7 | 39.2 |
| | $F_7$ | 4.5 | 34.7 | 39.2 |
| | $F_8$ | 10.8 | −15.7 | −4.9 |
| $F_R$ | $F_9$ | −18.3 | 10.8 | −7.5 |
| | $F_{10}$ | 37.5 | 3.6 | 41.1 |
| | $F_{11}$ | 37.5 | 3.6 | 41.1 |
| | $F_{12}$ | −18.3 | 10.8 | −7.5 |
| $F_L$ | $F_{13}$ | −18.3 | 10.8 | −7.5 |
| | $F_{14}$ | 37.5 | 3.6 | 41.1 |
| | $F_{16}$ | 37.5 | 3.6 | 41.1 |
| | $F_{16}$ | −18.3 | 10.8 | −7.5 |
| E | $E_1$ | 55.8 | 50.4 | 48.6 |
| | $E_2$ | 111.6 | 100.7 | 97.1 |
| | $E_{5,x}$ | 0.26 nm | 0.58 nm | |
| | $E_{5,y}$ | 0.73 nm | 0.37 nm | |

As seen from Table 4, template 108 performs better for metrics $E_1$, $E_2$ and while maintaining comparable performance to template 608a for metric $E_5$. Template 608b has poorer performance on $E_1$ and $E_2$ metric while $E_5$ is mixed results relative to the other templates.

TABLE 4

| $E(D_S)$ | Templates | | |
|---|---|---|---|
| | 108 | 608a | 608b |
| $E_1(M_x = 1$ ppm$)$ | 0.6N | 4.0N | |
| $E_1(M_y = 1$ ppm$)$ | 0.8N | 4.0N | |
| $E_1(M_x = 4$ ppm$)$ | 2.6N | 16.0N | 55.8N |
| $E_1(M_y = 4$ ppm$)$ | 3.3N | 15.9N | 50.4N |
| $E_1(M_x = M_y = 4$ ppm$)$ | 4.4N | 10.9N | 48.6N |
| $E_2(M_x = 1$ ppm$)$ | 23.2N | 30.4N | |
| $E_2(M_y = 1$ ppm$)$ | 23.2N | 30.4N | |
| $E_2(M_x = 4$ ppm$)$ | 92.6N | 121.7N | 111.6N |
| $E_2(M_y = 4$ ppm$)$ | 92.8N | 121.6N | 100.7N |
| $E_2(M_x = M_y = 4$ ppm$)$ | 131.4N | 162.9N | 97.1N |
| $E_{5,x}(M_x = 4$ ppm$)$ | 0.29 nm | 0.29 nm | 0.26 nm |
| $E_{5,y}(M_x = 4$ ppm$)$ | 0.21 nm | 0.23 nm | 0.73 nm |
| $E_{5,x}(M_y = 4$ ppm$)$ | 0.20 nm | 0.21 nm | 0.58 nm |
| $E_{5,y}(M_y = 4$ ppm$)$ | 0.47 nm | 0.45 nm | 0.37 nm |

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A nanoimprint lithography template comprising:
   a body having a front side with a shaping surface, and a back side having a central core-out that is located opposite the shaping surface;
   a first peripheral region bounded by:
     the central core-out;
     a first edge of the template; and
     a first set of two parallel perimeter lines orthogonal to the first edge and extending from the first edge to the central core-out; and
   a first peripheral pocket positioned in the first peripheral region.

2. The nanoimprint lithography template of claim 1, further comprising:
   a set of two or more deformation contact areas on the first edge of the body; and
   wherein the first peripheral pocket is positioned between a first subset of contact areas that includes an inner two of the set of two or more deformation contact areas.

3. The nanoimprint lithography template of claim 2, wherein the inner first subset of contact areas are located between the first set of two parallel perimeter lines.

4. The nanoimprint lithography template of claim 1, further comprising:
   a plurality of peripheral pockets including three additional peripheral pockets and the first peripheral pocket;
   wherein the plurality of peripheral pockets are arranged symmetrically around the central core-out.

5. The nanoimprint lithography template of claim 4, wherein sizes and shapes of the plurality of peripheral pockets are set, and positions of the plurality of peripheral pockets are arranged such that one or more distortion response metrics are improved relative to a template without the plurality of peripheral pockets.

6. The nanoimprint lithography template of claim 5, wherein improvements of the one or more distortion response metrics includes minimizing a first distortion response metric $E_1$ as described by equation:

$$E_1(D_S) = \max_{i=B,T,L,R}(\max(f_{1,i}(D_S)) - \min(f_{1,i}(D_S)));$$

$$f_1(D_S) = \{f_{1,B}; f_{1,T}; f_{1,L}; f_{1,R}\};$$

wherein $D_S$ is a simple distortion of the template;
wherein $f_1(D_S)$ is a set of forces that when applied to template sidewalls of the template are predicted to produce the simple distortion $(D_S)$;
wherein $f_{1,B}$ is a subset of forces in the set $f_1$ that are applied to a bottom side template sidewall of the template;
wherein $f_{1,T}$ is a subset of forces in the set $f_1$ that are applied to a top side template sidewall of the template;
wherein $f_{1,L}$ is a subset of forces in the set $f_1$ that are applied to a left side template sidewall of the template; and
wherein $f_{1,R}$ is a subset of forces in the set $f_1$ that are applied to a right side template sidewall of the template.

7. The nanoimprint lithography template of claim 6, wherein the simple distortion $(D_S)$ is a distortion of the template selected from a subset of distortion metrics consisting of:
   x-magnification $(M_x)$;
   y-magnification $(M_y)$;
   skew $(S_k)$;
   x-trapezoidal $(T_x)$; and
   y-trapezoidal $(T_y)$.

8. The nanoimprint lithography template of claim 7, wherein the set of forces $F_1$ are predicted to produce the simple distortion $D_S$ based on one or more of:

a set of experiments using a nanoimprint lithography shaping process; and a finite element simulation of the template.

9. The nanoimprint lithography template of claim 5, wherein improvements of the one or more distortion response metrics include minimizing a second distortion response metric $E_2$ as described by equation:

$$E_2(D_S) = \max_{i=B,T,L,R}\left(\sum_i f_{1,i}(D_S)\right);$$

$$f_1(D_S) = \{f_{1,B}; f_{1,T}; f_{1,L}; f_{1,R}\};$$

wherein $D_S$ is a simple distortion of the template;

wherein $f_1(D_S)$ is a set of forces that when applied to template sidewalls of the template are predicted to produce the simple distortion $(D_S)$;

wherein $f_{1,B}$ is a subset of forces in the set $f_1$ that are applied to a bottom side template sidewall of the template;

wherein $f_{1,T}$ is a subset of forces in the set $f_1$ that are applied to a top side template sidewall of the template;

wherein $f_{1,L}$ is a subset of forces in the set $f_1$ that are applied to a left side template sidewall of the template; and wherein $f_{1,R}$ is a subset of forces in the set $f_1$ that are applied to a right side template sidewall of the template.

10. The nanoimprint lithography template of claim 9, wherein the set of forces $f_1$ are predicted to produce the simple distortion $D_S$ based on one or more of:

a set of experiments using a nanoimprint lithography shaping process; and a finite element simulation of the template.

11. The nanoimprint lithography template of claim 5, wherein improvements of the one or more distortion response metrics include minimizing a third distortion response metric $E_3$ as described by equation:

$$E_3(D_S) = \Delta u_e(D_S) - A^* w(D_S)$$

wherein $D_S$ is a simple distortion of the template;

wherein w is a set of weights that when multiplied by the null space basis force vectors matrix λ to produce the set of forces F which when applied to the template sidewalls meet the constraints on the template and are predicted to produce the simple distortion $D_S$;

wherein A is a stiffness matrix of the template; and wherein $\Delta u_e$ is a set of distortions that are predicted or experimentally determined to have been produced by the set of forces F supplied to the template sidewalls.

12. The nanoimprint lithography template of claim 11, wherein the stiffness matrix A is determined based on one or more of:

a set of experiments using a nanoimprint lithography shaping process; and a finite element simulation of the template.

13. The nanoimprint lithography template of claim 11, wherein improvements of the one or more distortion response metrics includes minimizing a statistical value of the third distortion response metric $E_3$.

14. The nanoimprint lithography template of claim 5, wherein the one or more distortion response metrics includes a first set of distortion response metrics and a second distortion response metric; wherein the improvements of the one or more distortion response metrics includes:

minimizing the first set of distortion response metrics; and reducing the second distortion response metric below a threshold.

15. The nanoimprint lithography template of claim 4, wherein the plurality of peripheral pockets are arranged on the back side.

16. The nanoimprint lithography template of claim 1, wherein the first peripheral pocket is located on the backside of the template and does not interfere with flow of gas between the front side and a surface to be shaped by the template.

17. The nanoimprint lithography template of claim 1, wherein a peripheral pocket depth of the first peripheral pocket is the same as a core depth of the central core-out.

18. The nanoimprint lithography template of claim 1, wherein a portion of the template underneath the first peripheral pocket is thinner than a full thickness of the template.

19. A shaping system configured to use the nanoimprint lithography template of claim 1 comprising:

a template chuck configured to hold the template; and a template magnification control system configured to apply a set of forces to sets of deformation contact areas on each of the template sidewalls of the template.

20. A method of manufacturing an article comprising:

holding a template with a nanoimprint lithography template;

wherein the nanoimprint lithography template comprises:
  a body having a front side with a shaping surface, and
  a back side having a central core-out that is located opposite the shaping surface;
  a first peripheral region bounded by:
    the central core-out;
    a first edge of the template; and
    a first set of two parallel perimeter lines orthogonal to the first edge and extending from the first edge to the central core-out; and
  a first peripheral pocket positioned in the first peripheral region;

shaping formable material on a substrate with the nanoimprint lithography template;

curing the formable material between the template and the substrate to form a shaped film; and processing the shaped film on the substrate so as to create the article of manufacture.

\* \* \* \* \*